United States Patent [19]

Knobel et al.

[11] Patent Number: 5,068,061

[45] Date of Patent: Nov. 26, 1991

[54] ELECTROCONDUCTIVE POLYMERS CONTAINING CARBONACEOUS FIBERS

[75] Inventors: Thomas M. Knobel, Hackensack, N.J.; Francis P. McCullough, Jr., Lake Jackson; Lance L. Black, Richwood, both of Tex.

[73] Assignee: The Dow Chemical Company, Midland, Mich.

[21] Appl. No.: 447,990

[22] Filed: Dec. 8, 1989

[51] Int. Cl.$^5$ .......................... H01B 1/06; D02G 3/00
[52] U.S. Cl. .................................... 252/511; 524/495; 524/496; 428/365; 428/368; 428/369; 428/370; 428/373; 428/374; 428/408
[58] Field of Search ................. 252/511; 524/495, 496; 428/362, 365, 368, 369, 370, 373, 374, 408; 523/137

[56] References Cited

U.S. PATENT DOCUMENTS

| | | |
|---|---|---|
| 4,404,125 | 9/1983 | Abolins et al. ........................ 252/511 |
| 4,566,990 | 1/1986 | Lui et al. ............................... 252/503 |
| 4,602,051 | 7/1986 | Nabeta et al. ........................ 523/134 |
| 4,678,699 | 7/1987 | Kritchevsky et al. ............... 428/175 |
| 4,783,349 | 11/1988 | Cogswell et al. .................... 252/571 |

Primary Examiner—Josephine Barr

[57] ABSTRACT

A composition comprising a thermoplastic electroconductive resin matrix containing a multiplicity of reinforcing carbonaceous fibers, the improvement which comprises said reinforcing fibers comprising resilient shaped reforming elongatable non-linear non-flammable conductive carbonaceous fibers, the fibers having a reversible deflection ratio of greater than 1.2:1 and an aspect ratio (1/d) of greater than 10:1.

22 Claims, 1 Drawing Sheet a - STATIC CONTROL RESIN b - CARBONACEOUS FIBER/POLYMER MAT

- a — STATIC CONTROL RESIN
- b — CARBONACEOUS FIBER/POLYMER MAT

- b' — CARBONACEOUS FIBER
- c — NON-STATIC CONTROL RESIN

- c' — NON-CONDUCTIVE

ELECTROCONDUCTIVE POLYMERS CONTAINING CARBONACEOUS FIBERS

FIELD OF THE INVENTION

This invention relates to a composition of polymer resins containing carbonaceous fibers or fiber assemblies, methods for preparing the compositions, and structures and articles made from the compositions. More particularly, this invention relates to extrusion compositions, structures, and fabrication methods of polymer resin compositions useful for protecting sensitive electronics from electrostatic discharge and overstress. The present invention further encompasses the combination of several new materials in unique configurations which can be used to produce more ideal static control containers and materials.

BACKGROUND OF THE INVENTION

Static electricity is estimated to cost industry billions of dollars annually from damaged semiconductors and printed circuit boards. A support industry has developed that provides conductive, static shielding, and antistatic materials for electronics packaging and materials handling. Static control plastics include, for example, fiber, chemical or particle filled thermoplastics which are fabricated into films, bags, tote boxes, module carriers, dip tubes, and the like.

However, requirements for static control can vary. Generally, resistivities less than 1012 ohms (surface) are suitable and below 1010 ohms are ideal. A further advantage would be the incorporation of a Faraday Shield (a conductive layer or grid that reduces exposure of packaged electronic components to electrostatic "fields" as opposed to "discharges").

Heretofore, the art in static control has, primarily, consisted of two separate and distinct technologies, which can not be advantageously combined. The first conventional technology involves surface active systems including amine blooming agents numectants and surfactants. These systems perform by absorbing ambient moisture at the polymer structure surface forming an aqueous electrolyte microlayer capable of conducting dissipating, and/or attenuation electric charge along the structure's surface. Structures like this have no volume conductive properties.

The second conventional technology in static control involves the incorporation of conductive fillers. It is common to incorporate fillers like fibers, particles, and flakes into thermoplastic resins for reinforcement or modification of the resins' bulk mechanical properties. Similarly, electrically conductive fibers, for example, carbon black, powdered graphite, or graphite fibers, can be incorporated into thermoplastic resins to lend bulk conductive properties to the resin. Whether conductive carbon, carbon fibers, metal flakes, metal-coated fibers, or metal fibers are used, in all cases the additive levels must be high enough to assure particle to particle contact in the resin. In other words, in the case where fillers are used in a resin, the critical factor is volume loading, i.e., it is required that the conductive particles or fibers touch (or very nearly touch) each other to establish electrical continuity through the plastic structure. The resulting conductivity is strictly a function of the inherent conductivity of the conductive additive or filler. For example, when using carbon black as a filler, depending on particle surface area, particle diameter, and on blending parameters, the volume loadings required usually exceed 20 volume %, often ranging as high as 40 volume %. Such high loadings of carbon particles result in compromised physical properties, a black opaque material, and a material that can potentially slough carbon particles. Sloughing is a source of contamination of much concern in the electronics industry.

Conventional graphite or carbon fibers, due to their high dimensional aspect ratio (length to diameter, 1/d), can be added to significantly lower volume concentrations and still give bulk conductive properties to thermoplastics. Again, the magnitude of conductivity achieved depends on loading, fiber shape and size, compounding parameters, and the inherent conductivity of the fibers.

Typically, conventional conductive fiber loadings as low as 5 to 10 volume % have been used. The critical factor is fiber length, i.e., the longer the fibers the more likely they will touch, completing the electrical circuit. However, in the past the retention of fiber length during processing of the composition has been a key problem. Shear forces in processing equipment break the fibers, shortening their effective 1/d and reducing their usefulness. To compensate, a higher volume of fiber is added to the resin, contributing to material cost increases, polymer structure stiffening, opacity, and process complexity.

Further complicating matters, conventional fibers become more conductive through heat treatment, and with increasing inherent fiber conductivity comes both reduced fiber flexibility and increased fiber brittleness. Therefore, optimally one would like to compound into a thermoplastic a highly conductive fiber at low volume levels. However, the highly conductive fibers are more easily broken during processing. Hence, either the inherent conductivity or the volume added must be sacrificed to achieve repeatable, useful conductive thermoplastic structures.

U.S. Pat. No. 4,837,076 to McCullough et al, which is herein incorporated by reference, discloses a class of carbonaceous fibers used in the present invention.

U.S. Pat. No. 4,602,051 to Nabeta et al, which is herein incorporated by reference, discloses a resin composition with conventional carbon fibers which has an electromagnetic wave shielding effect. There is further disclosed a kneading and extrusion process which may be utilized in the present invention.

U.S. Pat. No. 4,678,699 to Kritchevsky, et al, which is herein incorporated by reference, relates to stampable thermoplastic composites containing a shielding layer against electromagnetic and radio frequency waves. There is utilized fibrous conductive filler materials which may also be used in the present invention.

The article entitled "EMI Shielding Through Conductive Plastics" by Simon, R. M., Polym. Plast. Technol. Eng., 17(1), 1–10 (1981), which is herewith incorporated by reference, discloses conductive plastics which can be utilized in the present invention.

It is therefore, desired to provide a novel composition that when prepared by conventional processing equipment, eliminates or ameliorates many of the problems associated with the prior art fibers and processes for producing the composition.

It is further desired to provide novel static control materials and structures with the following advantages over the prior art materials and structures.

It is further desired to provide novel static control materials and structures with surfaces having enhanced conductivity (less than 1010 ohms) without the presence of conductive particles or fibers at structure surfaces where they are potential contaminants.

It is further desired to provide novel static control materials and structures in which their surface resistivities can be controlled. By using differing thicknesses of film or extrudate on the outer surfaces, the surface electrical properties can be reproducibly adjusted.

It is further desired to provide novel static control materials and structures with thick rigid thermoplastic sheets which can be readily drawn-down without significant loss of electricals at edges and in corners.

It is further desired to provide novel static control materials and structures with special elongation properties of the fiber comprising the mat.

It is further desired to provide novel static control materials and structures with surface resistivities below 1010 ohms which can be achieved with filament loadings less than 1 volume %. This has very significant impact on the cost of delivered structures, since conductive fiber can make up more than 90% of the material cost in compounded, filled systems.

It is further desired to provide novel static control materials and structures which by concentrating the fiber in one thin layer (still achieving surface enhancement), it is possible to dramatically improve the translucency of structures. Present carbon black loaded structures are always opaque. The present invention reduces the amount of carbon black necessary.

It is further desired to provide novel static control materials and structures with surface electrical properties which are easily achieved and are two orders of magnitude better than prior art systems using surface systems such as amines, etc. as described above.

It is further desired to provide novel static control materials and structures with electrical properties which are permanent and non-humidity dependent. Conventional surface systems are not permanent and humidity dependent.

It is further desired to provide novel static control materials and structures which may be washed with no effect on electrical properties.

It is further desired to provide novel static control materials and structures which are stable with heat (160° F.) in aging experiments (12 days). None of the prior art surface systems has passed this test.

It is further desired to provide novel static control materials and structures which can readily be varied to provide some physical reenforcement to structures by using high tensile mat co-fibers.

It is further desired to provide novel static control materials and structures in the form of a mat to form structure inner layer(s) to allow for a variety of processing plans. The use of layered structures will avoid the use of loose fiber or carbon particles when necessary, will promote a homogeneous dispersion, and retain an optimum fiber length. When fibers are compounded as fillers in the prior art systems, the fiber length is always reduced by shearing and the resulting electricals worsen or at least become less predictable.

It is further desired to provide novel static control materials and structures prepared by calendering of an entangled mat to allow the fibers to be handled cleanly with minimum waste, high reproducability, and high line speed.

The term "carbonaceous" used herein refers to carbonaceous materials which have a carbon content of at least 65% and which are prepared by the method described in the U.S. Pat. No. 4,837,076.

SUMMARY OF THE PRESENT INVENTION

The present invention relates to a composition comprising an electroconductive static control resin matrix containing about 0.5 to 40% by weight of reinforcing and conductive carbonaceous fibers, the reinforcing fibers comprising resilient non-flammable elongatable non-linear non-flammable carbonaceous fibers, the fibers having a reversible deflection ratio of greater than 1.2:1 and an aspect ratio (1/d) of greater than 10:1, to the preparation of the compositions and to structures formed therewith. Advantageously, the resin is an ionically conductive synthetic resin which can achieve a resistivity of $10^{10}$–$10^{12}$.

Figure 1:
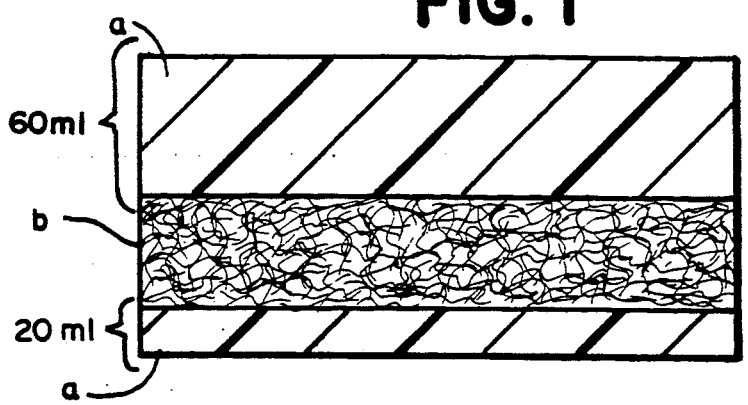
FIG. 1 is a cross-sectional view of a three layered composite article of the present invention.

The structures formed by the compositions of the invention will be useful in preventing "ghost bytes", and other manifestations of electrostatic damage in sensitive electronic equipment.

The presence of the carbonaceous fibers also provides a synergistic flame retarding effect especially when the fibers are found near the surface.

DETAILED DESCRIPTION OF THE PREFERRED EMBODIMENTS

The present invention in its broadest scope is directed to a composition which comprises a synthetic resin such as an ionically conductive polymeric material comprising polyurethanes, ethylene/carbon monoxide interpolymers, or their analogs and a novel carbonaceous fiber. The composition of this invention will be useful particularly in the management of static electricity in electronics manufacturing environments.

The composition of the present invention contains non linear, non-flammable resilient elongatable carbonaceous fibers having a reversible deflection ratio of greater than about 1.2:1 and an aspect ratio (1/d) of greater than 10:1. In a preferred embodiment, the carbonaceous fibers possess a sinusoidal or coil-like configuration or a more complicated structural combination of the two.

Static control resins based on urethanes, (ethylene/carbon monoxide interpolymer (ECO)), and similar polymers which can be used in the present invention are described in U.S. Pat. Nos. 4,617,325 and 4,618,630, both issued to Knobel et al.; incorporated herein by reference. Functionally, the polymers described in U.S. Pat. Nos. 4,617,325 and 4,618,630 can be formulated to achieve resistivities of $10^{10}$ to $10^{12}$ ohms. The polymers have proved suitable for injection molding, film blowing, and foaming by most conventional means.

In one embodiment of this invention, the polymer resin may include the individual carbonaceous fibers in the form of long or short fibers. In another embodiment, the fibers may be used in the form of a fiber assembly such as a yarn or tow composed of many filaments or a woven fabric, for example of plain weave, satin weave, twill weave, basket weave and the like. The fiber assembly may also be in the form of a non-woven material or fabric such as a mat, fluff or batting of fibers such as described in U.S. patent application Ser. No. 918,738, entitled "Sound and Thermal Insulation", filed 10-14-86, by McCullough et al.

The carbonaceous fibrous material of this invention can be formed readily in substantially any desired fabricated form. Fabricated items may include, for example, cloth such as herringbone weave cloth, twill weave tape, tubular woven fabric, paper, batts, blankets, roving, yarn, cord, rope, and non-woven structures.

The carbonaceous fibers of the present invention may be blended with other synthetic or natural fibers. Examples of the other reinforcing and/or conductive fibers that may be used include other carbonaceous or carbon fibers, cotton, wool, polyester, polyolefin, nylon, rayon, asbestos, glass fibers, fibers of silica, silica alumina, potassium titanate, silicon carbide, silicon nitride, boron nitride, boron, acrylic fibers, tetrafluoroethylene fibers, polyamide fibers, vinyl fibers, protein fibers, ceramic fibers such as aluminum silicate, and oxide fibers such as boron oxide, thoria and zirconia.

Once the fibers or fiber assemblies are produced they can be incorporated into the polymer resin matrix to produce various composite structures in substantially any fabricated form. For example, the fiber/polymer composite material of the present invention may be in the form of a sheet, or a three-dimensional shaped article suitable for ultimate use. The fiber/polymer composite material can be advantageously produced by impregnating or coating a base material composed of the carbonaceous fibers with the resin, by mixing and kneading the fibers with the matrix resin, or by laminating the fibers and matrix resin. The operation of impregnation, coating, mixing and lamination can be carried out by conventional methods.

For example, in one embodiment of the present invention, a plurality of carbonaceous fibers, in filament form, may be used as a filler material and incorporated into the polymer resin by a conventional extrusion process.

It is believed that the ionically conductive polymer systems such as disclosed in U.S. Pat. Nos. 4,617,325 and 4,618,630, when used in conjunction with the conductive carbonaceous fibers, the polymer fills the matrices between filler particles or fibers and can "short-circuit" current flow through the matrix, from fiber to fiber or particle to particle, reducing the need for filler particles to actually touch.

It is known that electrons can "hop" or "jump" across narrow gaps between conductive fillers even when the polymer matrix is insulative. Depending on the applied voltage, this distance can approach 100 angstroms. When the conductive polymer of the present invention is used as the matrix, this distance is dramatically increased and the volume of filler required for conductivity can be greatly reduced.

In extrusion processing a problem exists with fiber aspect retention. While the conductive polymer provides the advantage of lowering the volume of fiber filler needed or to some extent in decreasing the need for long fibers, a significant further improvement is seen when the carbonaceous fiber of the present invention is used in place of conventional conductive carbon or graphite fibers.

Because of the crinkly profile i.e. coil-like or sinusoidal shaped structure and the elongatability of the carbonaceous fiber of this invention, the fibers can withstand the rigors of extrusion compounding with a significantly greater tendency to retain effective fiber length. Many of the forces involved in extrusion compounding are more ductile than shear and the ability of the fiber to elongate and relax in the polymer melt allows for dissipation of breaking forces, for example during mixing of the polymer and fiber. It is believed that breaking forces may be similarly dissipated at die heads.

The specific advantages lie in the maximum retention of filament length (keeps required loadings low, costs low, and continuity high) and in the enhancement of electrical properties using a conductive matrix polymer (lowers filler loading still further).

Many combinations of compositions and structures are possible in this invention. The compositions prepared for a specific application will depend on the bulk electrical and mechanical properties desired by the end-user. Generally, it is felt that fiber loadings between 1 and 5% by weight are preferably used, in combination with polymers with inherent conductivities above about $10^{12}$ ohms. The fiber preferred in this invention are those with maximum elongation and conductivities below about $10^3$ ohms.

It is advantageous that the length of individual fibers be in the range of 0.5 to 20 mm, preferably, in the range of 2 to 10 mm. If the length is less than 0.5 mm, the conductivity of the resin composition is lowered to an unsatisfactory level due to an excessively small aspect ratio (l/d) of the fibers. In excess of 20 mm, there is difficulty experienced in the extrusion process. The diameter of the carbon fibers of the invention preferably have diameters ranging within 3 to 25 mm, more preferably 5 to 12 mm.

The extrusion compounding equipment involved and processing systems where the present system is beneficial are not limited to those noted in the example which follow, though some equipment and some conditions will still not be appropriate for fiber filler compounding into thermoplastics. The selection of the appropriate processing equipment is within the skill of those in the art.

The composition of the present invention comprising the conductive thermoplastic is particularly useful for injection molding of tote boxes but it may be quite useful for making conductive thermoformable sheets, films, or other structures produced by any of several known means.

In another embodiment of the present invention, a polymer/fiber composite can be formed into a layer structure or laminate which can then be thermoformed into a desired shape or article.

While it is possible to produce laminated or coextruded films and other structures from the prior art polymers having metallic interlayers, a disadvantage that such structures have is the inability for such structures to be thermoformed. Metallic interlayers cannot be "drawn-down" without tearing the metal layer because the metal layer lacks sufficient ductility. Conductive carbon-based layers of the prior art also are unsatisfactory because they show a tendency to thin out along edges and at corners during thermoforming resulting in loss of electrical continuity and reduction of static protection.

The above problems associated with prior art layers or laminates are eliminated by the use of the structures of the present invention.

These layered structure systems are volume conductive and the polymers in conjunction with highly conductive layers or fillers (based on metals or conductive carbon black) enhance surface electrical properties without generating a surface that is highly conductive or a potential source of contamination.

The layered structures of the present invention, advantageously contain a mat of conductive elongatable carbonaceous filaments such as described in U.S. patent application Ser. No. 918,738, entitled "Sound and Thermal Insulation", filed 10-14-86, by McCullough, et al. The special properties of the carbonaceous fibers allow the fibers to effectively fill edges and corners without disrupting electrical continuity, and in combination with the volume conductive resins, enhanced surface electrical properties are manifested.

In a further embodiment of preparing the layered structures of the present invention, a non-woven mat consisting of a blend of carbonaceous fibers and polymeric fibers is first prepared as described in copending U.S. patent applications Ser. Nos. 856,305 and 918,738. The relationship between elongation and conductivity can be utilized to meet specific requirements for surface conductivity and thermoformability. Generally, the greater the fiber heat history the higher the conductivity and the lower the elongatability.

The carbonaceous fibers of the present invention in mat form have two further advantages over many commercially available carbon fibers in mat formation: 1. the elongatability of the carbonaceous fibers is excellent as compared to commercially available fiber which have limited elongation (less than 100%); and 2. the carbonaceous fibers, because of their crinkly nature, give improve entanglement which makes for a better, quicker, and more homogeneous blend with polymer fibers.

The polymeric fiber used for the blend may be, for example, polyolefins such as fiber grade polypropylene, and the like. Preferably, the polymeric fibers are spun from a static control ECO resin that has inherent static control properties. With the use of ECO fibers a significant reduction in filament loading is expected. It is advantageous to keep the carbonaceous fiber/polymer fiber blend at a ratio of about 1:1.

If too much polymeric fiber is added, encapsulation of the carbonaceous fibers during the lamination process such as calendering may occur. The polyethylene fibers, for example, are electrically insulating and the lamination process would tend to isolate the volume conductive ECO in the outer layers from the conductive carbonaceous inner layers resulting in reduction of continuity. If too much carbonaceous fiber is used, a reduction in thermoformability may occur. This will have significant adverse impact on costs.

Any other polymeric fiber can be used in the present invention, limited only by its ability to intermingle with the carbonaceous fiber and by its interaction during lamination, coextrusion, or extrusion coating. Experiments have already shown that polyester fibers can be mechanically intermingled and the resulting mat calendered. Such a mat may have particular advantage when used in conjunction with static control thermoplastic urethane polymer sheeting as discussed below.

It may also be possible and advantageous to use high modulus polyolefin fibers in order to increase or modify some of the mechanical properties of the final structure. For example, polypropylene or high density polyethylene fibers could be used. The value of such substitutes should be balanced against the thermoforming properties desired.

The polymers used in the present invention for the outer layers include those described in U.S. Pat. Nos. 4,617,325 and 4,618,630. In another embodiment, thermoplastic urethane (TPU) formulations can be used. The ECO resins are preferred because of their relative low cost, however, the TPU's are more transparent than ECO resins and advantageously have a very high abrasion resistance.

By varying the thickness of the outer static control layers of the final structure, the surface electrical properties of the structure can be controlled. In another embodiment, the amount of salt or type of salt added to the polymer can be varied as a means of controlling the surface electrical properties of the structure. Furthermore, enhancers, for example, those discussed in U.S. Pat. No. 4,618,630 can be added to the polymer resin to increase conductivity or lower the amount of salt required to achieve a specific level of conductivity. Other salts and polymer substrates which can be used in the present invention.

The configuration of the thermoformable structure produced by the present invention may vary widely depending on utility and cost factors. For example, as shown in FIG. 1, a three-layered structure (aba), as produced in Example 2 below, can be produced having two outer layers, a, of static control resin and an inner layer, b, of carbonaceous fiber/polymer fiber mat. If desired, conductive carbon black may be added as a filler to the resins.

Figure 2:
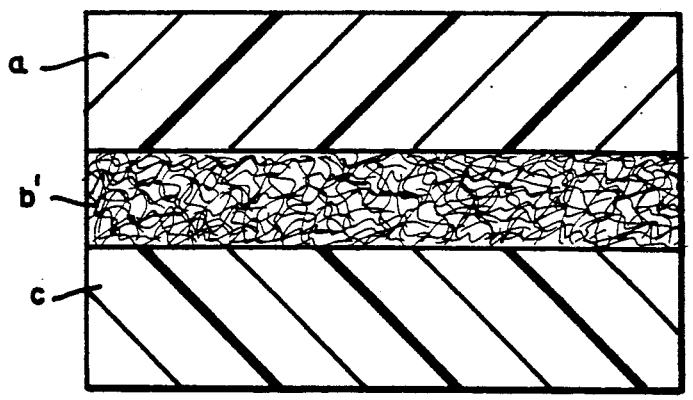
FIG. 2 is a cross-sectional view of another three layered composite article of the present invention.

As shown in FIG. 2, a three-layered structure (ab'c) can be produced wherein a layer, a, is a static control resin, a layer, b', is a carbonaceous fiber layer and a layer, c, is a non-static control resin. This structure will have enhanced surface conductivity on only one side.

Figure 3:
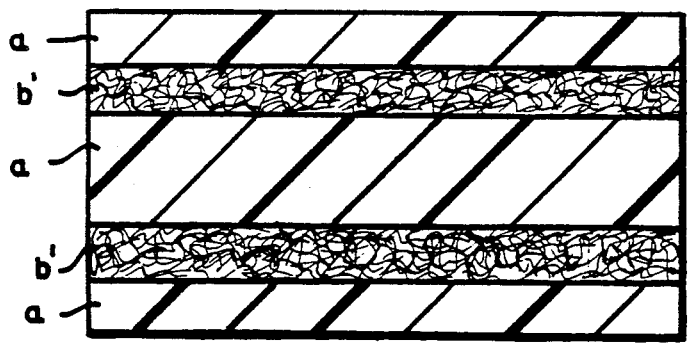
FIG. 3 is a cross-sectional view of a five layered composite article of the present invention.

In another embodiment shown in FIG. 3, a five-layered structure (ab'ab'a) can be produced. This structure incorporates two conductive carbonaceous fiber-containing layers, b', near the surface of the structure to lend higher enhancement to surface electricals. A static control resin layer, a, is used as a thick center layer to make the structure volume conductive establishing continuity from the top of the structure to the bottom of the structure.

Figure 4:
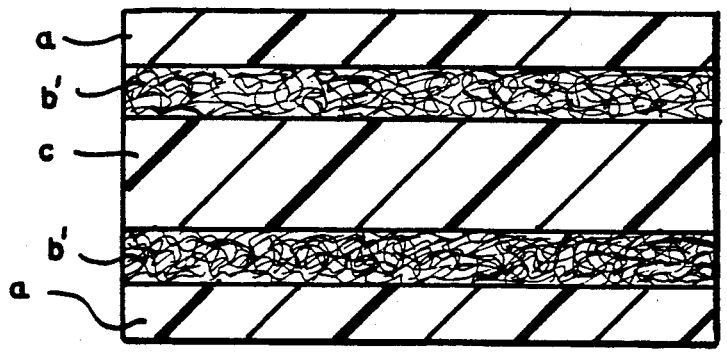
FIG. 4 is a cross-sectional view of another five layered composite article of the present invention.

In yet another embodiment shown in FIG. 4, a five-layered structure (abc'ba) can be produced wherein the center layer, c', is non-conductive. The non-conductive layer, c', may be a reinforcing layer of high modulus polymer, or a low modulus polymer to aid thermoforming and fabrication. The center lay may also compose a flexible or rigid foam, or any suitable web including paper. This configuration is not totally volume conductive and is discontinuous from the top of the structure to the bottom of the structure. A very low cost resin could also be used in the center to reduce overall structure cost.

In still another embodiment, a four-layered structure (abca) can be produced when it is desired to obtain a structure with low conductivity on one side and enhanced conductivity on the other side. Advantageously, the cost of the structure may be relatively lower, for example in application where enhanced static protection is required only on one side such as the inside of a module box.

In still another embodiment, the same three-, four- and five-layered structures described above can be produced except that "a" is replaced by an alternative static control material, such as another volume conductive layer or a layer based on conventional surface active systems such as an amine.

The preformed mat and various resin layers can be brought together by any conventional method. For example, the mat can be welded between two preformed sheets as illustrated in the Example 2 below. The mat can be mated to a preformed sheet such as an extruded sheet and then a blown or cast film can be laminated on the top. One or both outer layers can be applied by extrusion coating. Tie layers can be used when necessary to increase layer bonding. However, the tie layers may affect electrical continuity. "Edge folding" or capping can be used when it is desired to keep ends and edges free of exposed fiber. Alternatively exposed edges as "through bolting" might be preformed sheets made by direct extrusion or by injection molding.

The following examples are included herebelow as a means of illustrating the present invention, and not for purposes of limiting the invention.

EXAMPLE 1—FILLED STRUCTURES

The purpose of this example was to determine the extent that 1 wt. % of the carbonaceous fiber of the present invention will enhance electricals, i.e. static decay time (SDT) and surface resistivity (SR) by compounding the fiber into a 1 wt. % sodium triflate-15 wt. % carbon monoxide (CO)/ethylene carbon monoxide (ECO) resin.

A 1.034 lb. sample of 1% sodium triflate-15% CO/ECO was compounded with a 0.0103 lb sample of PANOX (stabilized polyacrylonitrile fiber of RK Textiles) fiber 6K which was heat treated at 650° C. according to the procedure of U.S. Pat. No. 4,837,076 to be made non-linear and carbonaceous (resulting in a 1 wt. % fiber in the resin) on an extrusion compounding machine (Wayne) at 375 degrees F. The mixture was passed through the extrusion machine two times.

The compounded material was then pressed using a conventional platen pressing apparatus at 325 degrees F. to form a film structure of the compounded material.

The procedure used to determine the static decay time (SDT) of the resulting structure on an Electrotech 406C static delay meter was the Federal Test Method Standard No. 101C, Method 4046.1. The procedure used to determine the surface resistivity (SR) of the resulting structure was the ASTM D 257-78 method. The electricals of the flat film, 3×5 inches square, of the resultant compounded material above were measured and the results were as follows:

SDT was 8.21 seconds.
SR was $1.2 \times 10^{13}$ ohms

EXAMPLE 2—LAYERED STRUCTURE

A layered structure, A1BA2, was prepared wherein the first layer, A1, consisted of a layer of a 1% sodium triflate-20% CO/ECO, 60 mil in thickness. The layer, B, sandwiched between the two A layers consisted of a layer of Panox (heat treated prior to this step as described in Example 1 at 950 degrees C.). The second layer, A2 was a layer of a 1% sodium triflate-20% CO/ECO, 20 mil in thickness. The final layered structure was produced by pressing the three layers, A1BA2, together using a platen pressing apparatus at 325 degrees F. to form an 82 mil thick final layered structure having a 1% fiber content by weight. The electricals of the structure was measured by the methods described in Example 1. The SDT was found to be 0.01 seconds. The SR of the 60 mil side of the structure was $4.8 \times 10^{14}$. The SR of the 20 mil side of the structure was $1 \times 10^6$.

EXAMPLE 3–5—LAYERED STRUCTURES

General Procedure

Pressed plaques are made by sandwiching non-linear carbonaceous fibers between layers of antistat-ECO/HDPE/antistat-ECO to build structures of desired thickness, strength, and conductive properties. The structures are prepared by using a Drake Press and platened at 325 degrees C.

The carbonaceous fibers are calcined to remove impurities-the higher the temperature, the higher conductive character of the fiber—it will also reduce the elasticity of the fiber.

Sample 1

An ABCBA layered structure was made wherein
Layer A = 17 mil thick of 1% ST-15% CO/ECO (as in Example 1)
Layer B = PANOX 3K heat treated at 950 degrees C.
Layer C = 85 mil thick of 1% sodium tetraphenolboron compounded with a blend of fifty percent of 15% CO/ECO and fifty percent of HDPE.
Layer B = Panox 3K heat treated at 950 degrees C.
Layer A = 17 mil thick of 1% ST-15% CO/ECO
The total amount of fiber in the structure was 1 wt. % and the resulting structure was pressed to 100 mil thickness.

Sample 2

An ABCBA layered structure was made wherein
Layer A = 17 mil thick of 1% ST-15% CO/ECO
Layer B = PANOX 6K heat treated 950 degrees C.
Layer C = 85 mil thick of 1% sodium tetraphenolboron compounded with a blend of fifty percent of 15% CO/ECO and fifty percent of HDPE.
Layer B = Panox 6K (950 degrees C.)
Layer A = 17 mil thick of 1% ST-15% CO/ECO
The total amount of fiber in the structure was 1 wt. % and the resulting structure was pressed to 83 mil thickness.

Sample 3

An ABCBA layered structure was made wherein
Layer A = 17 mil thick of 1% ST-27% CO/ECO
Layer B = PANOX 3K heat treated at 950 degrees C.
Layer C = 85 mil thick of 1% sodium tetraphenolboron compounded with a blend of fifty percent of 15% CO/ECO and fifty percent of HDPE.
Layer B = Panox 3K heat treated at 950 degrees C.
Layer A = 17 mil thick of 1% ST-27% CO/ECO
The total amount of fiber in the structure was 1 wt. % and the resulting structure was pressed to 100 mil thickness.

Comparative Sample A

An ABA layered structure was made wherein
Layer A = 1% ST-15% CO/ECO
Layer B = 1% sodium tetraphenolboron compounded with a blend of fifty percent of 15% CO/ECO and fifty percent of HDPE.
Layer B = 1% ST-15% CO/ECO

Comparative Sample B

A layered structure was made consisting of 1% sodium tetraphenolboron compounded with a blend of fifty percent of 15% CO/ECO and fifty percent of HDPE.

TABLE I

| Sample | SDT (sec) | SR (ohms/sq.) |
|---|---|---|
| 1 | 0.01 | $2.1 \times 10^{12}$ |
| 2 | 0.01 | $1.3 \times 10^{13}$ |
|   | 0.02 | $7.2 \times 10^{10}$ |
| A | 0.31 | $1.9 \times 10^{13}$ |
| B | 0.13 | $4.4 \times 10^{13}$ |

EXAMPLE 6—LAYERED STRUCTURE

The purpose of this example was to utilize carbonized Panox non-linear fiber (25%) matted with a LLDPE (75%) fiber grade polyethylene resin) as a part of the laminated structure to better disperse the fiber across the structure. The curly nature of the fiber by itself, makes it difficult to achieve uniformity. The other part of the structure is 1% sodium triflate in 80% CO/ECO as the volume conductive media.

The density of the fibrous mat was 9.82 mg/cc. The
The density of the fibrous mat was 9.82 mg/cc. The lamination was carried out by pressing a plaque at 325 degrees F. using a Drake Press.

A layered structure, ABCBA, was prepared wherein:
Layer A = 10 mil thick of 1% ST-20% CO/ECO
Layer B = 25% PANOX (heat treated at 550 degrees C.) 75% Aspun ®
Layer C = 42 mil thick of 1% ST-20% CO/ECO
Layer B = 25% PANOX (heat treated at 550 degrees C.) fiber/75% Aspun@
Layer A = 10 mil thick of 1% ST-20% CO/ECO The total amount of fiber in the structure was 2 wt. % and the resulting structure was pressed to 58 mil thickness.

The resulting electricals were as follows:
SDT = 0.01 seconds and SR = $2.0 \times 10^9$.

EXAMPLES 7-9

General Procedure

A 1 inch compounding extruder, MPM Extruder, was used at 350 degrees F. to compound the materials to form the following fiber and resin mixtures.

Comparative Sample A

A sample of 0.7 wt. % sodium triflate/15% CO/ECO blended resin was prepared. To the sample was added 5% Red Dye LDPE to add color. The electricals of the sample was then measured and shown in Table II below.

A sample of 1 wt. % ST-18% CO/ECO was compounded with 1% Panox fiber and its electricals measured as shown in Table II below.

Comparative Sample B

A sample of 15% CO/ECO with 1% STPB resin was prepared and its electricals measured as described in Table II below.

Sample 2

A laminate structure, ABA, was prepared wherein:
Layer A = 43 mil thick of 1% ST-20% CO/ECO
Layer B = 25% PANOX (heat treated at 550 degrees C.) fiber/75% LLDPE
Layer A = 43 mil thick of 1% ST-20% CO/ECO The total amount of fiber in the structure was 0.7 wt. % and the resulting structure was pressed to 75 mil thickness. The electricals measured are described in Table II below.

Sample 3

A laminate structure, ABCBA, was prepared wherein:
Layer A = 18 mil thick of 1% ST-20% CO/ECO
Layer B = 25% PANOX (heat treated at 550 degrees C.) fiber/75% LLPDE
Layer C = 85 mil thick of 1% STPB-60% of 10% CO/ECO and of HDPE
Layer B = 25% PANOX (heat treated at 550 degrees C.) fiber/75% Aspun@ fiber/75% Aspun@
Layer A = 18 mil thick of 1% ST-20% CO/ECO The total amount of fiber in the structure was 0.6 wt. % and the resulting structure was pressed to 122 mil thickness. The electricals measured are described in Table II below.

TABLE II

| Sample | SDT (sec) | SR (ohms/sq.) |
|---|---|---|
| A | 23.5 | $8.1 \times 10^{13}$ |
| B | 0.03 | $1.3 \times 10^{11}$ |
| 1 | 0.62 | $9.2 \times 10^{11}$ |
| 2 | 0.02 | $3.3 \times 10^9$ |
| 3 | 0.01 | $5.8 \times 10^9$ |
| C | 0.15 | $6.4 \times 10^{12}$ |

A small piece of mat was calendered to produce a coherent non-woven sheet of carbonaceous fiber and partially melted polymer fiber. Roller configurations, temperatures, and line speed were used to control mat quality.

The resin used in this example was a 20% CO ethylene/carbon monoxide interpolymer. The base resin is a blend.

Sodium triflate (trifluoromethanesulfonate) was dry blended into the resin by extrusion compounding at 1 wt. % level. The polymer extrudate was melted and pressed into plaques about 43 mils thick. The surface resistivity of the polymer plaques was $1.4 \times 10^{11}$ ohms.

EXAMPLE 10

A non-woven mat of a plurality of elongatable carbonaceous fibers of the present invention was formed by intertangling the elongatable carbonaceous fibers with polymer fibers. The polymeric fibers were olefin, more specifically, polyethylene fibers commercially manufactured from fiber grade polyethylene resins. The blend consisted of 25% by weight of the olefin (polyethylene) fiber (1-2 inches staple, 10 denier) and 75% of the carbonaceous fiber prepared from a precursor fiber (Panox fiber) processed to render it elongatable and conductive. In this example the filaments fibers were processed through a Rando-Webber apparatus. Machine conditions were optimized to promote intermixing and entanglement. The result is a half-inch thick loose mat with a approximate density of 280 grams/cubic foot.

In lieu of polyethylene fibers there may be utilized ECO fibers.

What is claimed is:

1. In a composition comprising a thermoplastic electroconductive resin matrix containing a multiplicity of reinforcing carbonaceous fibers, the improvement which comprises said reinforcing fibers comprising resilient shaped reforming elongatable non-linear non-flammable conductive carbonaceous fibers, the fibers having a reversible deflection ratio of greater than 1.2:1 and an aspect ratio (1/d) of greater than 10:1 and said resin matrix containing from about 0.5 to about 40 percent by weight, based on the composition, of the carbonaceous fibers.

2. The composition of claim 1 wherein the fibers have a sinusoidal configuration.

3. The composition of claim 1 wherein the fibers have a coil-like configuration.

4. The composition of claim 1 wherein the resin is ionically conductive.

5. The composition of claim 1 wherein the composition is in the form of a sheet.

6. The composition of claim 1 wherein the composition is in the form of a three-dimensional shaped article.

7. The composition of claim 1 wherein the resin is an ethylene/carbon monoxide interpolymer resin.

8. The composition of claim 1 wherein the resin is polyurethane.

9. The composition of claim 1 containing from about 1 to about 5% by weight of carbonaceous fibers 10. The composition of claim 1 wherein the carbonaceous fibers have an average length of 0.5 to about 20 mm.

11. The composition of claim 1 wherein the carbonaceous fibers are in the form of a cloth or fabric.

12. The composition of claim 1 wherein the carbonaceous fibers are continuous carbonaceous fibers.

13. The composition of claim 1 wherein the carbonaceous fibers have diameter between 3 and 25 microns and a length between about 5 and 12 m.

14. The composition of claim 1 including polyethylene fibers in an amount to provide a carbonaceous fiber to polyethylene fiber blend at a ratio of about 1:1.

15. A static control composite comprising at least two thermoplastic resin layers, at least one of said thermoplastic layers being ionically conductive, and a layer comprising conductive flexible non-linear carbonaceous fibers between said thermoplastic resin layers, said carbonaceous fibers having a reversible deflection ratio greater than 1.2:1 and an aspect ratio of greater than 10:1, and said carbonaceous fibers comprising about 0.5 to about 40 percent by weight of said layer.

16. The composite of claim 15 wherein the surface resistivity is below $10^{10}$ ohms.

17. The composite of claim 15 wherein said carbonaceous fibers are in the form of a fiber assembly.

18. The composite of claim 15 wherein said carbonaceous fibers are within a polymer resin matrix.

19. The composite of claim 15 wherein said ionically conductive layer comprises an ethylene/carbon monoxide interpolymer.

20. The composite of claim 15 wherein said ionically conductive layer comprises polyurethane.

21. The composite of claim 15 comprising two layers of non-linear carbonaceous fibers.

22. The composite of claim 15 wherein said carbonaceous fibers are blended with ethylene/carbon monoxide interpolymer fibers.

* * * * *